United States Patent [19]

Wolaver et al.

[11] Patent Number: 4,682,116
[45] Date of Patent: Jul. 21, 1987

[54] HIGH SPEED PHASE LOCKED LOOP FILTER CIRCUIT

[75] Inventors: Dan H. Wolaver, Worcester, Mass.; Warren E. Little, Salem, N.H.

[73] Assignee: General Signal Corporation, Stamford, Conn.

[21] Appl. No.: 761,355

[22] Filed: Aug. 1, 1985

Related U.S. Application Data

[62] Division of Ser. No. 474,489, Mar. 11, 1983, Pat. No. 4,547,747.

[51] Int. Cl.⁴ .......................... H03K 5/00; H03B 1/00
[52] U.S. Cl. .................................. 328/167; 307/520; 307/549; 328/127
[58] Field of Search ...................... 328/127, 165, 167; 307/490, 520, 491, 521, 549; 331/17, 25

[56] References Cited

U.S. PATENT DOCUMENTS

| | | | |
|---|---|---|---|
| 3,852,674 | 12/1974 | Van Roessel | 328/127 |
| 3,944,940 | 3/1976 | Desai | 329/122 |
| 4,135,165 | 1/1979 | Coe | 331/11 |
| 4,138,615 | 2/1979 | McKinlay | 328/127 |
| 4,215,430 | 7/1980 | Johnson, Jr. | 375/111 |
| 4,280,104 | 7/1981 | Rzeszewski | 331/1 A |

Primary Examiner—Stanley D. Miller
Assistant Examiner—Timothy P. Callahan
Attorney, Agent, or Firm—Barnes & Thornburg

[57] ABSTRACT

A phase locked loop circuit for high frequency digital electronic signals is provided which includes a loop filter having a substantially infinite bandwidth and wherein the sum of the frequency comparator and phase comparator output signals is actively integrated by an operational amplifier and summed with a flat, passively attenuated signal from the phase comparator. The PLL circuit includes a phase comparator having a full adder employing current mode logic so as to reduce parasitic capacitances and stray voltages, a frequency comparator having an additional, final flip-flop means out of the final combinatorial logic so as to retain the polarity of the final waveform transition, and an inhibiting circuit to disable the output of the final flip-flop of the frequency comparator when phase lock is attained by adding a complementary signal thereto.

2 Claims, 11 Drawing Figures

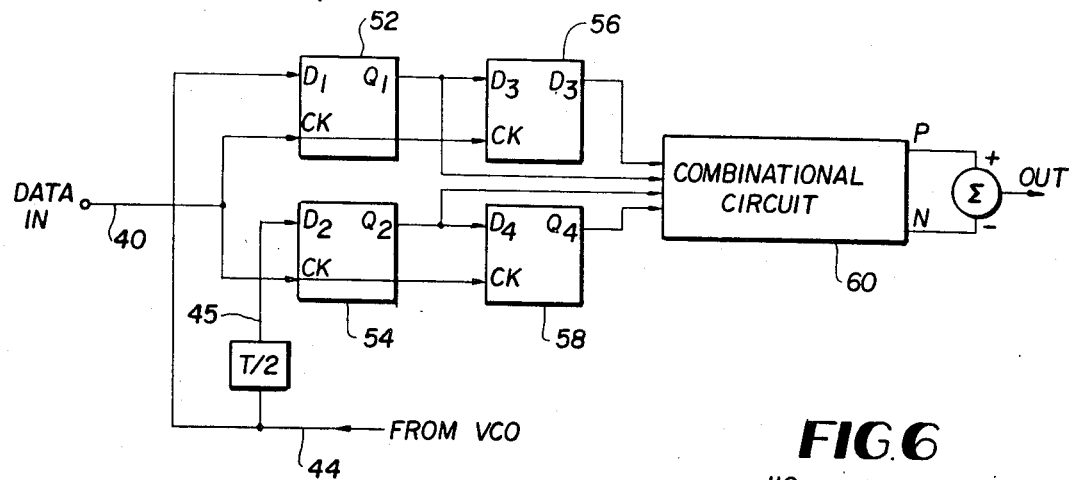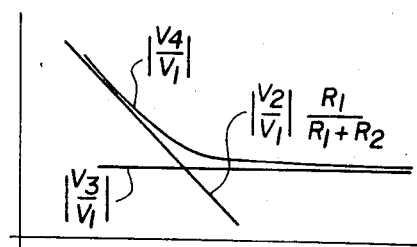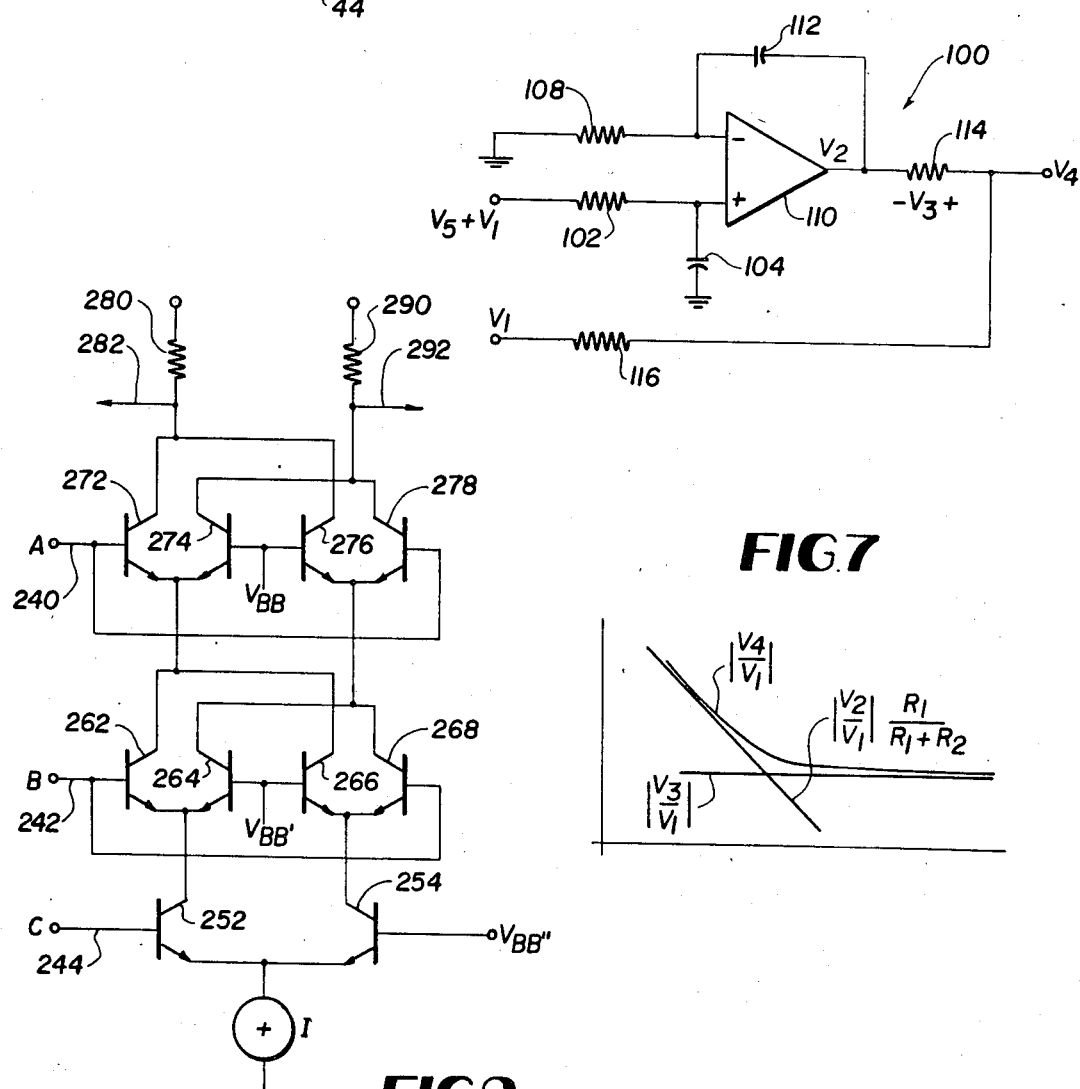

HIGH SPEED PHASE LOCKED LOOP FILTER CIRCUIT

This is a divisional of application Ser. No. 474,489, filed Mar. 11, 1983, now U.S. Pat. No. 4,547,747.

BACKGROUND OF THE INVENTION

The present invention relates generally to high frequency digital communications test equipment, and more particularly, to phase locked loop circuits therein.

In order to test and measure the quality of signals in equipment at high speed rates, it is necessary to detect and hold that data signal. Generally, phase locked loop circuits used for this purpose have a phase detector to compare the phase of input data signals to the phase of reference signals generated by a voltage controlled oscillator. The difference between these two signals is used to generate an error signal which is fed back to the voltage controlled oscillator through a loop filter so as to control the frequency of its signal output in a direction that reduces this phase difference. Phase locked loops are also known to include a frequency detector having inputs from the data signal and the reference signal and also providing a control signal to the voltage controlled oscillator (VCO) as a function of the frequency difference between these two input signals. When used in combination with the phase detector, the frequency detector provides a rough tuning of the phase locked loop and the phase detector provides a fine tuning. FIG. 1 shows a block diagram of such a phase locked loop having a frequency detector to aid in signal acquisition.

Conventional loop filters typically need to provide for integration and proportionality of input signals thereto. Active circuit elements, such as operational amplifiers, are known to provide sufficient integration of such signals and are commonly employed in loop filters. Unfortunately, with the high frequency input signals, loop filters having active elements in the control path between the phase comparator and the VCO suffer from poor proportionality control: these active elements cause a flat response bandwidth roll off. Passive proportionality filters are known which include passive integrating means, usually capacitors, but this integration has a small dynamic range.

FIG. 2 shows a schematic diagram for a typical non-inverting loop filter for second order phase locked loops (PLL), such as shown in FIG. 1. Operational amplifier 20 has an input signal voltage $V_1$ connected at its positive input across resistor 12 of $R_1$ value. $V_1$ is also connected to ground, or a fixed reference voltage, through capacitor 14 of C value and resistor 16. The negative input to operational amplifier 20 is connected to ground, or a fixed reference voltage, through resistor 18 of $R_1$ value and also connected to a negative feedback loop having capacitor 22 of C value in series with resistor 24 of $R_2$ value. If $V_1$ was connected to the negative input of operational amplifier 20 and the positive input connected to the feedback loop and ground, loop filter 20 would be an inverting loop filter, but with no loss of generality with respect to the discussion below. Loop filter 20 takes the output signal $V_1$ produced by the phase comparator or the sum of the output signal voltages produced by the frequency comparator and the phase comparator and integrates that signal or sum and provides control in an output voltage $V_4$, which is the control voltage to the VCO to reset it at the proper frequency. Resistor 24 in series with capacitor 22 in the negative feedback loop provides proportional control over a range of input signal frequencies.

However, because resistor 24 is in the negative feedback loop of operational amplifier 20, the flat response bandwidth suffers a roll-off above the unity gain frequency of the operational amplifier, as shown in FIG. 3. This unity gain frequency is about 1 MHz for most inexpensive op amps. While these conventional circuit elements may perform satisfactorily at low frequency environments, in high frequency phase locked loops a proportionally greater bandwidth is usually desirable. Thus, it would be desirable in such high frequency circuits to eliminate this roll-off of the flat response caused by the operational amplifier since it limits the phase lock loop bandwidth.

FIG. 4 shows a schematic diagram for a conventional phase comparator suitable for use in the PLL of FIG. 1. Exclusive OR gate 46 receives input data signals from data transmission line 40 and data delay line 42. Thus, incoming signals are compared with the delayed version of themselves to produce a signal B output from exclusive OR gate 46. Signal B and reference clock signals C produced by the VCO and input by transmission line 44 are inputs to exclusive OR gate 48, which produces an output signal voltage $V_1$. If the clock signal and signal B are 90 degrees out of phase, the average output signal from exclusive OR gate 48 is 0. As the phase of the clock signal advances relative to signal B, the average output signal from this exclusive OR gate becomes positive. As the clock signal is delayed, the average output signal becomes negative. Again this conventional circuit performs well at low frequencies of input signals, but experiences problems when input data signals have high frequencies. While the VCO has a high Q circuit and, thus, can easily produce narrow clocking pulses, signal B, produced by exclusive OR gate 46, is more difficult to produce as it is as narrow as the clock pulses. Since signal B has gaps without pulses from time to time, it must be generated by logic means and without resonant circuits. For example, at 432 MHz, the pulses of signal B must be 1.2 nanoseconds wide, and the highest speed logic means available commercially today can only produce these pulse widths marginally. Furthermore, since conventional phase detectors for PLLs employ discrete exclusive OR elements, injection noises and parasitic capacitances are present which limit performance at high frequencies.

When acquiring lock, a phase locked loop often needs to act like a frequency comparator. It can do this with a phase comparator for frequency differences up to about 10 times the loop bandwidth. For narrow bandwidth loops, this may not be sufficient. To achieve satisfactory jitter performance, the bandwidth should be sufficiently narrow, compared with the bit rate of the incoming data signals, but this provides a correspondingly narrow pulled-in range. In an attempt to solve this problem, prior PLLs have included frequency comparators to help the PLL acquire lock. One such frequency comparator is a "quadracorrelator". However, quadracorrelators require a broad band 90 degrees phase shift in these high frequency environments. One attempt to solve this problem is shown in U.S. Pat. No. 4,015,083 to Bellisio, wherein signal transitions are turned into narrow pulses by differentiating. Again, however, at high frequencies the narrow pulses become a problem to generate.

FIG. 5 shows another frequency comparator for phase locked loops found in the prior art. Digital input data signals from transmission line 40 are compared with VCO-generated reference clock signals from line 44 and delayed clock signals 45 in flip-flops 52, 54, 56 and 58. Flip-flops 52 and 54 output signals corresponding to the present frequency comparison, while flip-flops 56 and 58 output signals corresponding to previous frequency comparisons. Each of these flip-flops inputs a signal to combinational circuit 60, which produces an output signal $V_5$. This combinational circuit may be designed so that for example, a positive pulse is produced for every cycle slip of phase when the data signal frequency is greater than the reference signal frequency from the VCO and a negative pulse is produced for every cycle slip of phase when the reference signal frequency from the VCO is greater than the input data signal frequency. The negative and positive pulses are then averaged in order to produce final frequency error voltage at the output of the frequency comparator. However, for high frequency environments, this frequency comparator experiences significant problems. At high frequencies, input waveforms have significant jitter and distortion which, at small frequency differences between the data and reference signals, prevent a definitive control pulse from being generated: waveforms may be in phase at some points but not at others over the entire length of the wave. Thus, logic becomes analog, i.e., there are no clear "1"s and "0"s. The phase and frequency relationship jitters at the zero crossing so much that many alternate positive and negative pulses are generated during a cycle slip. The fact that the number of positive pulses exceeds by one the number of negative pulses (when the data signal frequency is greater than the reference signal frequency) may be buried when the average is taken. This results in a significant offset in the transfer characteristic of the frequency comparator in high-frequency applications.

For PLL circuits to properly recover clock from high-speed data (300 Mb/s and above), each of the problems discussed—with the loop filter, with the phase comparator, and with the frequency comparator—must be solved.

BRIEF DESCRIPTION OF THE DRAWINGS

FIG. 5 shows a block diagram of a conventional frequency comparator employed in the PLL of FIG. 1.

FIG. 6 shows a schematic diagram of a loop filter for use in a PLL according to the present invention.

FIG. 7 shows a gain verses frequency graph for the loop filter shown in FIG. 6.

FIG. 9 shows a schematic diagram of the summing logic of the full adder of the phase comparator shown in FIG. 8.

SUMMARY OF THE INVENTION

Figure 1:
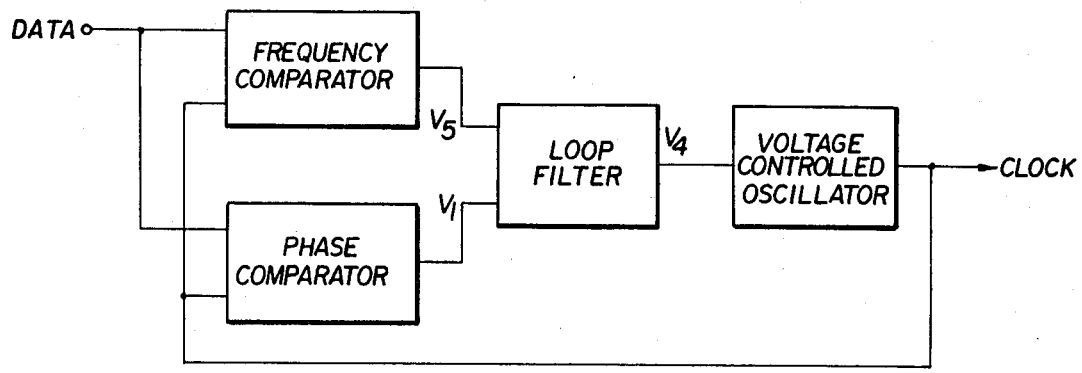
FIG. 1 shows a block diagram of a conventional phase locked loop circuit.
Figure 2:
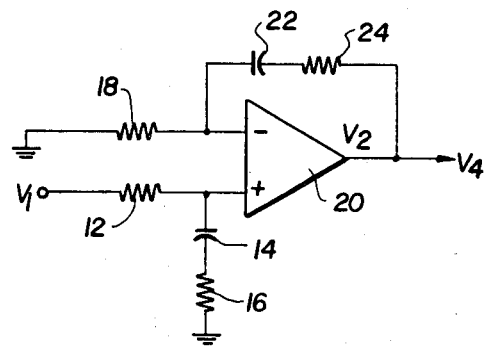
FIG. 2 shows a schematic diagram of a conventional loop filter employed in the PLL of FIG. 1.
Figure 3:
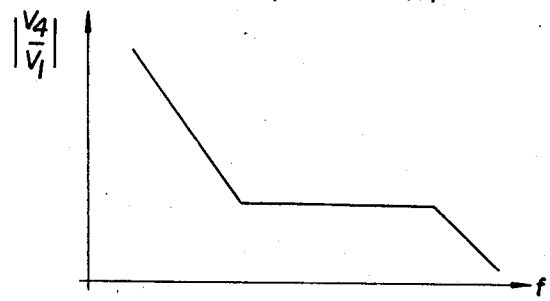
FIG. 3 shows a gain verses frequency graph for the loop filter shown in FIG. 2.

An object of the present invention is the provision of an improved phase locked loop circuit for use in high frequency environments.

Another object is to provide a loop filter circuit for phase locked loop systems having an increased flat gain bandwidth.

A further object of the invention is the provision of a phase comparator circuit for phase locked loop systems having small parasitic capacitances and low injection noise.

Still another object is to provide a frequency comparator for phase locked loop systems suitable for use with high frequency input signals which emphasizes the last waveform transition and prevents it from being lost.

These and other objects of the present invention are attained in the provision of a phase locked loop circuit responsive to input data signals and having phase and frequency comparators, loop filter means, and reference signal generating means.

The loop filter means controls the operation of the reference signal generator so as to cause the reference signals produced thereby to alter to conform to the input data signals. This loop filter has an operational amplifier with a feedback loop which actively integrates the sum of the phase and frequency comparators' output signals and a voltage divider which passively attenuates the output signals of the phase comparator so as to provide proportionality. These integrated and attenuated signals are summed passively to provide loop filter output signals to the reference signal generator. Thus, while maintaining the large dynamic range of active integration, the loop filter suffers no limitation to its bandwidth from operational amplifier limitations.

The phase comparator employs the logic means of a full adder or an integrated circuit in a current routing logic mode to produce an output signal representative of the phase difference between the input data signals and the reference signals. This arrangement avoids creating parasitic capacitances and stray voltages which adversely affect the reference signal generator.

The frequency comparator employs latch and logic gate means which respond to the difference in frequency between the input data signals and the reference signals to produce output signals of opposite polarity. A final latch means monitors these output signals and maintains the polarity of the last signal.

An inhibitor circuit is provided for use with this frequency comparator which disables the output of the final flip-flop of the frequency comparator to the loop filter when phase lock occurs. This inhibitor includes a control signal trigger responsive to the output of a quadrature phase comparator and logic and signal inverting means responsive to control signals from that trigger so as to produce signals cancelling or aiding the frequency comparator output signals. Complementary signals are added to the output signals of the final latch means of the frequency comparator to produce a zero net output signal when phase lock occurs.

Other objects, advantages, and novel features of the present invention will become apparent from the following detailed description of the invention when considered in conjunction with the accompanying drawings.

DESCRIPTION OF THE PREFERRED EMBODIMENTS

The present invention employs a frequency-phase locked loop of the general configuration shown in FIG. 1 but improves upon the prior art by employing novel and unobvious circuit components to achieve surprising and unexpected results which permit use with high frequency input data signals. A loop filter is provided having a virtually infinite bandwidth such that the PLL system bandwidth is now only limited by the VCO bandwidth. A phase comparator is provided using a full adder integrated circuit and current mode logic so as to decrease parasitic capacitances and injection noises or stray voltage signals having a detrimental effect on the VCO. A frequency comparator is also provided having novel output logic and an additional final flip-flop out of the combinatorial logic on an integrated circuit so as to maintain proper polarity of output signals in high frequency environments. Further, a novel inhibiting circuit is provided which disables the output of the frequency comparator final flip-flop when phase lock is attained.

FIG. 6 shows loop filter 100 for use in high speed or high frequency PLL circuits according to the preferred embodiment of the present invention. Operational amplifier 110 receives input signals from either output signal voltage $V_1$ or the sum of output signal voltages $V_1$ and $V_5$ from the phase comparator and frequency comparator, respectively, to its positive input across resistor 102 means of value $R_1$. $V_1$ and $V_5$ may be summed by a variety of summing techniques, the present invention not being limited to a particular implementation. This input signal is also connected through resistor 102 to ground through capacitor 104 of value C. Throughout the specification when a circuit or circuit element is said to be connected to ground, it should be understood that the present invention specifically contemplates the equivalence of a connection thereto with a fixed reference potential. The negative input of operational amplifier 110 is grounded through resistor 108 and is connected to an integrating negative feedback loop containing capacitor 112. Resistor 108 may, for example, be of a value equal to whatever parallel combination of individual resistor elements comprises resistor means 102. Operational amplifier 110 produces an output signal voltage $V_2$ which is an integration of the sum of input signal voltages $V_1$ and $V_5$ or the single input signal $V_1$.

Resistor 114, of value $R_2$ and having a voltage $V_3$ across it, is connected to the output of operational amplifier 110 on one side and to the loop filter output voltage $V_4$ on the other side. Resistor 116 of a value $R_1$ forms a passive voltage divider with resistor 114 with output voltage $V_4$ therein. $V_1$ is input to and feeds forward through this voltage divider as $V_1$ and $V_5$ are fed forward through operational amplifier 110. Signal voltage $V_1$ is input to this voltage divider across resistor 116.

Resistor 114 provides a flat gain response with virtually no roll-off at high frequencies, unlike conventional active loop filters, because it is outside the operational amplifier's integrating feedback loop. The voltage divider has virtually unlimited frequency response and attenuates the $V_1$ input signal to maintain proportionality. The $V_5$ signals do not need proportionality since their primary function is to charge capacitor 112 and, thus, they are only integrated in the loop filter circuit.

Loop filter 100 thus provides an active, integrating control path through operational amplifier 110 separate from a passive, proportionality control path through the voltage divider. Input signals through these two control paths are passively summed to produce output voltage $V_4$. Therefore the present invention provides a circuit having the advantage of two different prior art circuits without their inherent disadvantages.

FIG. 7 shows the gain of loop filter 100 with respect to frequency. As can be seen, the bandwidth is virtually infinite. In conventional PLL systems, the bandwidth of the loop filter was a limiting factor on the overall system bandwidth. The present invention allows the overall system bandwidth to be extended until the limits of the VCO bandwidth. The VCO does not have an infinite bandwidth since the operational amplifier output through resistor 114 acts as a buffer for the VCO so that its varactor is not shorted out, but this VCO bandwidth is many times greater than conventional loop filter bandwidths.

The PLL bandwidth is determined by the bandwidth of its component circuits and the interaction therebetween and, therefore, is finite even if each element therein has an infinite bandwidth. In prior PLL systems, if the PLL bandwidth was pushed out beyond the loop filter bandwidth, the system became unstable. The present invention provides the advantage of system stability up to the VCO bandwidth.

Figure 8:
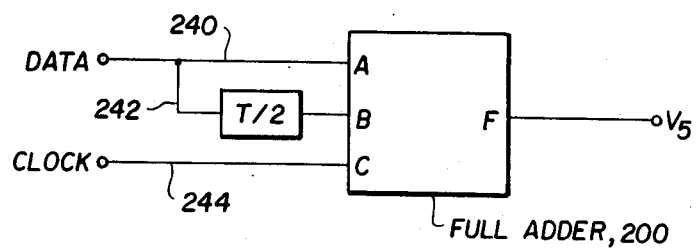
FIG. 8 shows a block diagram of a phase comparator for use in a PLL according to the present invention.

FIG. 8 shows a phase comparator for use in high speed PLLs of the present invention. Full adder 200 is an integrated circuit having input signals from input data transmission line 240, delayed data line 242, and VCO reference signal clock line 244 and producing output signals $V_1$. Full adder 200 generally includes means for providing the digital sum and carry in and carry out means for binary input signals. The phase comparator of the present invention employs the summing capabilities of this full adder on an integrated circuit to produce an output signal, $V_1$, in response to phase differences between the input signals. In comparison with the conventional phase comparator shown in FIG. 4, signal B is an internal or carry in point in the combinatorial logic. Since it is internal, most parasitic capacitances found with the use of discrete circuit elements are eliminated. Also, there is no stray signal leak from this integrated circuit to the VCO. Such stray voltages have required prior high speed PLL systems to provide extensive shielding about the VCO.

Most prior full adder devices employ voltage mode logic. Within full adder 200, it has been found to be particularly advantageous to employ current routing logic. This avoids having to generate narrow intermediate voltage pulses, and the parasitic capacitances associated therewith, at points within the phase comparator.

FIG. 9 shows a schematic diagram for current mode logic in full adder 200. Transistors 252 and 254 share a common emitter line, but receive base input signals from reference signal clock line 246 and bias voltage $V_{BB}''$ respectively. The collector line of transistor 252 is connected to the common emitter line of transistors 262 and 264, and the collector line of transistor 254 is connected to the common eitter line of transistors 266 and 268. The base input signals for transistors 262 and 268 are from delayed data line 242, and the base input signals for transistors 264 and 266 are from bias voltage $V_{BB}'$. The collector lines of transistors 262 and 266 are combined and connected to the common emitter line for transistors 272 and 274. Likewise, the collector lines from transistors 264 and 268 are connected to the common emitter line for transistors 276 and 278. The base input signals from transistors 272 and 278 are from input data line 242, and the base input signals for transistors 274 and 276 are from bias voltage $V_{BB}$. The collector lines from transistors 272 and 276 are combined and connected to output line 282. The collector lines for transistors 274 and 278 are combined and connected to output line 292. Logic switching occurs between the emitter lines. Resistors 280 and 290 serve to convert the final output signal back to a voltage mode output signal $V_1$.

Figure 4:
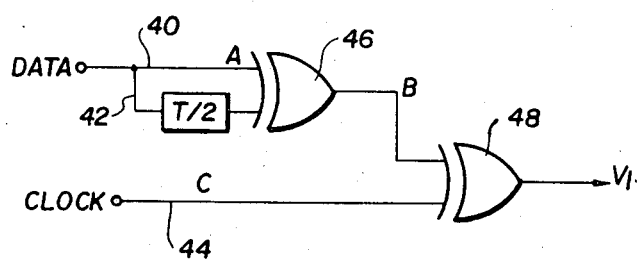
FIG. 4 shows a schematic diagram of a conventional phase comparator employed in the PLL of FIG. 1.

The three stacked transistor stages permit current mode logic which produces results equivalent to two cascaded exclusive OR gates, such as found in the phase comparator shown in FIG. 4. The difference between the base input voltages determines which emitter receives current. The three bias voltages are selected so as to be less than their expected corresponding input signal voltages so that current does not flow through their transistors when the opposing transistors in that stage receive input signals.

Thus, the logic switching between emitters creates the following current paths. When none of the full adder input lines 242, 244, or 246 has a signal thereon, the current path is through transistors 254, 266, and 274 to output line 292. When reference signal clock line 244 alone inputs a signal, the current path is through transistors 252, 264, and 276 to output line 282. Likewise, when delayed data line 242 alone inputs a signal the current path is through transistors 254, 268, and 276 to output line 282, and when data transmission line 240 alone inputs a signal, the current path is through transistors 254, 266, and 252 to output line 282. Finally, when all three full adder input lines 240, 242, and 244 have input signals thereon the current path is through transistors 252, 262, and 272 to output line 282.

However, when clock line 244 and delayed data line 242 both input signals to full adder 200, the current path is through transistors 252, 262, and 274 to output line 292. Likewise, when input data line 240 and delayed data line 242 both input signals, the current path is through transistors 254, 268, and 278 to output line 292; when data transmission line 240 and reference signal line 244 both input signals, the current path is through transistors 252, 264, and 278 to output line 292. When the current path is to resistor 280, line 282 goes low, and when the current path is to resistor 290, line 292 goes low.

Figure 10:
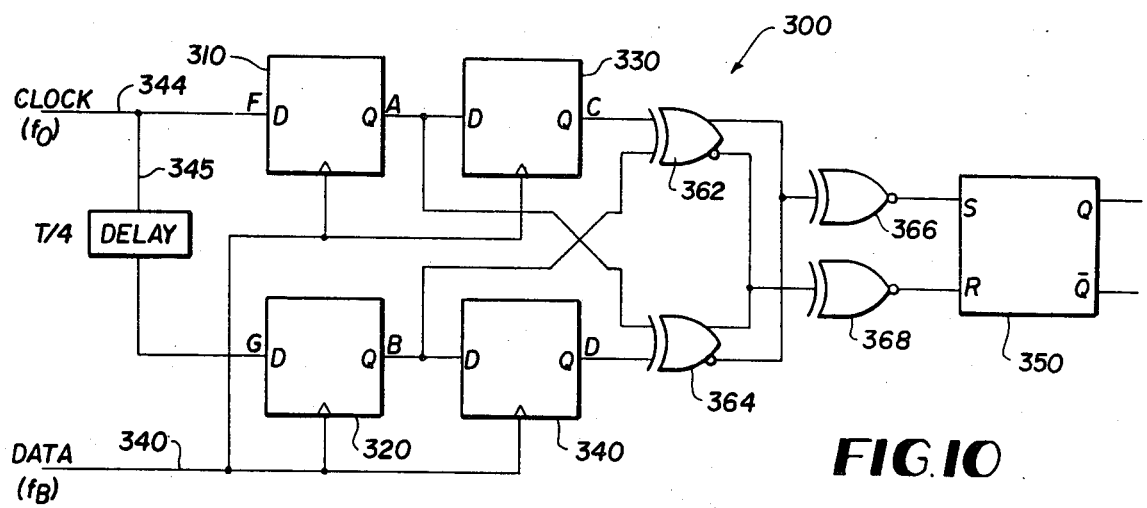
FIG. 10 shows a schematic diagram of a frequency comparator for use in a PLL according to the present invention.

FIG. 10 shows a frequency comparator 300 for use in high speed PLLs of the present invention. This frequency comparator works with pulses no narrower than the input data bit frequency. Comparator 300 is constructed as a hybrid inntegrated circuit so as to eliminate stray voltages, injection noise, and parasitic capacitances. Input data signal line 340, VCO reference signal and line 344, and delayed reference signal line 345, causing T/4 signal delay for example, are inputs to frequency comparator 300. Delayed reference signal inputs function as quadrature clock signals. Within this frequency comparator, latch means such as D-type flip-flops 310, 320, 330, and 340, corresponding with flip-flops 52, 54, 56, and 58 of conventional frequency comparator, are provided which receive input signals and transmit output signals to exclusive OR gates 362 and 364 with non-inverting and inverting outputs.

Flip-flops 310 and 320 compare the phase of the digital data signals to the phase of reference and quadrature clock signals, respectively. The waveforms input to flip-flops 310 and 320 may be designated F and G, respectively as illustrated in FIG. 10. When the data signal frequency is less than the reference signal frequency, the positive transitions of input data signals slip to the right through the reference and quadrature clock signal waveforms. Likewise, when the input data signal frequency is higher than the clock frequency, the transitions slip to the left. If, for example, the reference signal from the VCO through line 344 is a square wave and the quadrature clock signal through line 345 is delayed by 90 degrees, as input data signal transitions slip to the right, FG counterclockwise sequence 00,10,11,01,00 results. Similarly, as data transitions slip to the left, the FG clockwise sequence is 00,01,11,10,00.

Cascading logic gate pairs 362 and 364, and 366 and 368 are provided to compare previously sampled F and G sequences, stored in flip-flops 330 and 340 and outputted as signals C and D, respectively, with the most recent sequences stored in flip-flops 310 and 320 and outputted as signals A and B, respectively, and respond to changes therein.

Exclusive OR gate with inverted output 362 has signals C and B as inputs. Exclusive OR gate with inverted output 364 has signals A and D as inputs. Exclusive NOR gate 366 has inputs from OR gate 362 and the inverted output of OR gate 364. Exclusive NOR gate 368 has inputs from OR gate 364 and the inverted output of OR gate 362. The output signals of gates 366 and 368 are designated S and R, respectively, and are inputs to final latch means or flip-flop 350. Table 1 below shows the truth table of this combinatorial logic circuit for changes clockwise or counterclockwise in sequences AB with respect to sequence CD. Counterclockwise changes are indicated by a R signal; clockwise changes are indicated by an S signal.

Thus, flip-flops 310, 320, and 340 and logic means 362, 364, 366, and 368 create positive and negative pulses representing the frequency difference or mismatch between the input data and reference signal frequencies. Final flip-flop 350 is provided to monitor these mismatch signals and serves to latch the polarity of the last pulse. Through flip-flop 350, therefore, output signal $V_5$ is high when the sequence change is counterclockwise and the data signal has the lower frequency, and signal $V_5$ is low when the sequence change is clockwise and the clock signal has the lower frequency.

TABLE 1

| AB/CB | Input to Gate | | Output of Gate | | | Input to Gate | | Output of Gate |
|---|---|---|---|---|---|---|---|---|
| | 362 | 364 | 362 | 364 | 366 | 368 | 366 | 368 |
| 00/00 | 00 | 00 | 0/1 | 0/1 | 01 | 10 | 0 | 0 |
| 10/00 | 00 | 10 | 0/1 | 1/0 | 00 | 11 | 1 | 0 |
| 1100 | 10 | 10 | 1/0 | 1/0 | 10 | 01 | 0 | 0 |
| 01/00 | 10 | 00 | 1/0 | 0/1 | 11 | 00 | 0 | 1 |
| 00/10 | 01 | 00 | 1/0 | 0/1 | 11 | 00 | 0 | 1 |
| 10/10 | 01 | 10 | 1/0 | 1/0 | 10 | 01 | 0 | 0 |
| 11/10 | 11 | 10 | 0/1 | 1/0 | 00 | 11 | 1 | 0 |
| 01/10 | 11 | 00 | 0/1 | 0/1 | 01 | 10 | 0 | 0 |
| 00/11 | 01 | 01 | 1/0 | 1/0 | 10 | 01 | 0 | 0 |
| 10/11 | 01 | 11 | 1/0 | 0/1 | 11 | 00 | 0 | 1 |
| 11/11 | 11 | 11 | 0/1 | 0/1 | 01 | 10 | 0 | 0 |
| 01/11 | 11 | 01 | 0/1 | 1/0 | 00 | 11 | 1 | 0 |
| 00/01 | 00 | 01 | 0/1 | 1/0 | 00 | 11 | 1 | 0 |
| 10/01 | 00 | 11 | 0/1 | 0/1 | 01 | 10 | 0 | 0 |
| 11/01 | 10 | 11 | 1/0 | 0/1 | 11 | 00 | 0 | 1 |
| 01/01 | 10 | 01 | 1/0 | 1/0 | 10 | 01 | 0 | 0 |

The frequency of operation for the embodiment of frequency comparator 300 shown in FIG. 10 is limited only by the transition time of the logic gates, which is typically 0.7 nanoseconds. Thus, frequency comparator 300 can handle data signals at a frequency of about 600 MHz. The D-type flip-flops are not a limiting factor since they can toggle at a rate of 750 MHz.

Unlike the conventional frequency comparator shown in FIG. 5, frequency comparator 300 employs final flip-flop 350 to latch on the final polarity of the output signal, rather than depend on the average number of positive pulses and negative pulses and keep track of their difference. Thus, the last transition does not get lost in the high frequency signal jitter. Frequency comparator 300 further differs from the comparator of FIG. 5 in the use of different output logic to update flip-flop 350 more often and of an integrated circuit realization which avoids parasitic capacitances.

Figure 11:
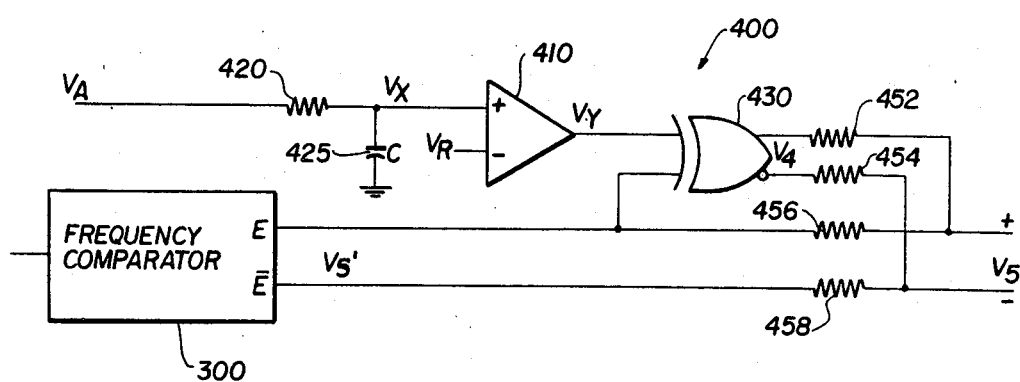
FIG. 11 shows a schematic diagram of an inhibitor circuit for use with the frequency comparator of FIG. 10.

FIG. 11 shows an inhibiting circuit 400 for use with frequency comparator 300. Comparator 300 avoids high speed instability by emphasizing the last data signal transition but this signal remains memorized in flip-flop 350 until another transition occurs. When frequency error is zero, i.e., when the PLL approaches lock, it is desirable to turn off this output signal from frequency comparator 300. Circuit 400 serves this function and includes operational amplifier 410 receiving signals from the PLL phase comparator to its positive input through resistor 420. This positive input is also connected to ground through capacitor 425 such that a low pass filter means is formed with resistor 420. A quadrature phase comparator providing input signals $V_A$ to operational amplifier 410 indicative of phase lock may be formed by D-type flip-flop 310 within frequency comparator 300. During phase lock, this flip-flop always samples in the middle of a clock pulse and, thus, signal $V_1$ is always high. Prior to phase lock, signal $V_1$ is a beat note of decreasing frequency as lock approaches. Voltage $V_x$ through the low pass filter means of circuit 400 is low until the filter detects that signal $V_1$ is turned on for a predetermined period of time indicating phase lock and provides a high output signal.

Operational amplifier 410 acts as a control signal trigger and produces an output voltage $V_y$ which is input to exclusive OR gate 430 with noninverting and inverting outputs along with output $V_5'$ of flip-flop 350 of the frequency comparator 300. The outputs of gate 430 are coupled across resistors 452 and 454, with the output frequency comparator 300, across resistors 456 and 458. The output of the operational amplifier 410 acts as a control signal to convert the exclusive OR 430 between an noninverting gate and an inverting gate. When phase lock occurs, i.e., the output of 410 is high, the output of gate 430 becomes the complement of the output of frequency comparator 300, and when these signals are combined, the net output signal $V_5$ is zero. When phase lock has not occured for the prerequisite period, i.e., the output of 410 is low, the output of 430 is added to $V_5$ and may be "supplementary", such that the net output signal is larger than the output signal of flip-flop 350 alone. The values of resistors 452, 454, 456, and 458 are selected to produce the desired sum as the frequency comparator output.

From the preceding description of the preferred embodiment, it is evident that the objects of the invention are attained. Although the invention has been described and illustrated in detail, it is to be clearly understood that the same is by way of illustration and example only and is not to be taken by way of limitation. The spirit and scope of this invention are limited only by the terms of the appended claims.

What is claimed is:

1. A loop filter means, for use in a phase locked loop circuit having reference signal generating means, and having frequency comparison means and phase comparison means which produce input signals for said loop filter means, comprising:

operational amplifier means having inverting and non-inverting inputs, output and integrating feedback means for noninvertingly integrating input signals from said frequency and phase comparison means, said input signals being connected to said non-inverting input;

said integrating feedback means comprising feedback capacitor means connecting the output of said operational amplifier means to the inverting input of said operational amplifier means;

second capacitor means connecting the noninverting input of said operational amplifier means to a reference potential;

voltage divider means having first and second inputs and an output, the output of said operational amplifier means being connected to said first input of said voltage divider means and selected inputs from one of said input signals being connected at said second input of said voltage divider means, said voltage divider means attenuating and summing said output of said operational amplifier means and said selected input signal to provide an output signal of said loop filter means at said output of said voltage divider means.

2. The loop filter means according to claim 1 wherein input signals from said phase comparison means are said selected input.

* * * * *